(12) United States Patent
Chen

(10) Patent No.: US 7,508,693 B2
(45) Date of Patent: Mar. 24, 2009

(54) ONE-TIME-PROGRAMMABLE (OTP) MEMORY DEVICE AND METHOD FOR TESTING THE SAME

(75) Inventor: Chung-Kuang Chen, Pan Chiao (TW)

(73) Assignee: Macronix International Co., Ltd., Hsinchu (TW)

( * ) Notice: Subject to any disclaimer, the term of this patent is extended or adjusted under 35 U.S.C. 154(b) by 0 days.

(21) Appl. No.: 11/388,905

(22) Filed: Mar. 24, 2006

(65) Prior Publication Data
US 2007/0223266 A1    Sep. 27, 2007

(51) Int. Cl.
*G11C 17/00* (2006.01)
(52) U.S. Cl. .................. 365/94; 365/185.01; 365/201
(58) Field of Classification Search .............. 365/94, 365/185.01, 201
See application file for complete search history.

(56) References Cited

U.S. PATENT DOCUMENTS 6,313,502 B1 * 11/2001 Widdershoven ............. 257/323

2007/0076464 A1 * 4/2007 Koebernick et al. ......... 365/100

FOREIGN PATENT DOCUMENTS

| CN | 1619704 | 5/2005 |
| CN | 1679117 | 10/2005 |

OTHER PUBLICATIONS

English abstract of CN1619704.
English abstract of CN1679117.

* cited by examiner

*Primary Examiner*—Huan Hoang
(74) *Attorney, Agent, or Firm*—Thomas, Kayden, Horstemeyer & Risley

(57) ABSTRACT

An OTP memory device and method for testing the same is disclosed. The memory device includes a number of memory cells and each memory cell has an initial threshold voltage. Each memory cell is programmed to have a first threshold voltage larger than a maximum value of the initial threshold voltages in the test program operation. When the memory device is test pass, the memory device is directly provided for a user program operation without need of an erase operation.

12 Claims, 2 Drawing Sheets

ONE-TIME-PROGRAMMABLE (OTP) MEMORY DEVICE AND METHOD FOR TESTING THE SAME

BACKGROUND OF THE INVENTION

1. Field of the Invention

The invention relates in general to a one-time-programmable (OTP) memory device and method for testing the same, and more particularly to an OTP memory device and method for testing the same, in which a first program operation is performed to check the memory device and test-pass memory device is supplied to a user without erase operation.

2. Description of the Related Art

For one-time-programmable (OTP) products such as oxide-nitride-oxide read only memory (NROM) devices, technical engineers usually need to use a normal program algorithm to check whether each memory cell on the whole chip can have a good operation. One way to test the memory device is to program a row and a column of test memory cells on the chip. The whole memory array is determined to be good if data can be written into the test memory cells successfully during programming. Although this test method is time-saving, the test result is indeed unreliable for it cannot verify all the memory cells on the chip are good.

Another method to test the memory device is to program the whole array cells. After the test program operation, an erase operation is performed on that chip in order to clear the memory cells for user program. Usually, two or three program-and-erase cycles are required to achieve the test purpose. The erase operations increase the charge loss in programming and consequently the NROM device needs ten times cycling margins for a program operation, thereby reducing the quality of the memory device. In the meanwhile, the size and cost of the memory device is increased due to extra erase circuits for erase function disposed on the chip.

SUMMARY OF THE INVENTION

It is therefore an object of the invention to provide a novel OTP memory device and method for testing the same, in which a first program operation is performed to test the memory device and no erase operations are needed before the user performs a second program operation to write data into the memory device. Therefore, not only the quality of the memory device can be improved, but also the size and cost of the memory device can be reduced.

The invention achieves the above-identified object by providing an OTP memory device including a number of memory cells. Each memory cell has an initial threshold voltage. Each memory cell is programmed to have a first threshold voltage larger than a maximum value of the initial threshold voltages and a user program operation is performed directly on the programmed memory cells.

The invention achieves the above-identified object by providing a method for testing an OTP memory device. The memory device includes a number of memory cells, and each memory cell has an initial threshold voltage. The method includes performing a first program operation on the memory device such that each memory cell has a first threshold voltage larger than a maximum value of the initial threshold voltages; and performing a read operation on the memory device to test if the memory cells are good, wherein when the memory device is test OK, the memory device is directly provided for a user program operation.

Other objects, features, and advantages of the invention will become apparent from the following detailed description of the preferred but non-limiting embodiments. The following description is made with reference to the accompanying drawings.

DETAILED DESCRIPTION OF THE INVENTION

Figure 1:
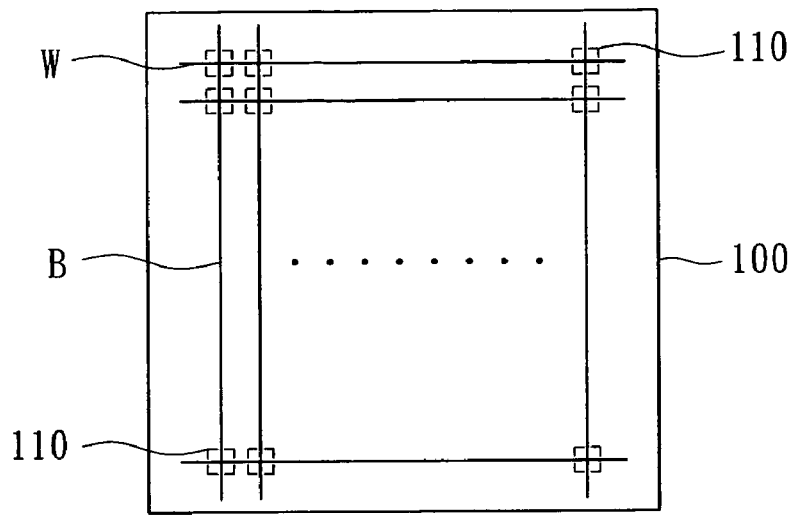
FIG. 1 is a schematic diagram of an OTP memory device according to a preferred embodiment of the invention.

Referring to FIG. 1, a schematic diagram of an OTP memory device according to a preferred embodiment of the invention is shown. The OTP memory device 100, such as a NROM device or a floating gate device, includes a number of memory cells 110 for storing data. Each memory cell 110 is horizontally coupled to other cells 110 via a word line W and is vertically coupled to other cells 110 via a bit line B for transmitting data.

Unlike the conventional OTP memory device, the OTP memory device 100 of the invention performs a first program operation for testing the memory cells 110 by programming the memory cells 110 to a small higher and more tightened threshold voltage (VT) range. When the memory device 100 is test OK, it is directly provided for a user program operation. After the test program operation, no erase operations are necessarily performed on the memory cells 110. Therefore, the required program margin for the user program operation can be reduced, the quality of the memory cells 110 can be improved, and the size and cost of the memory device 100 can be reduced.

Figure 2:
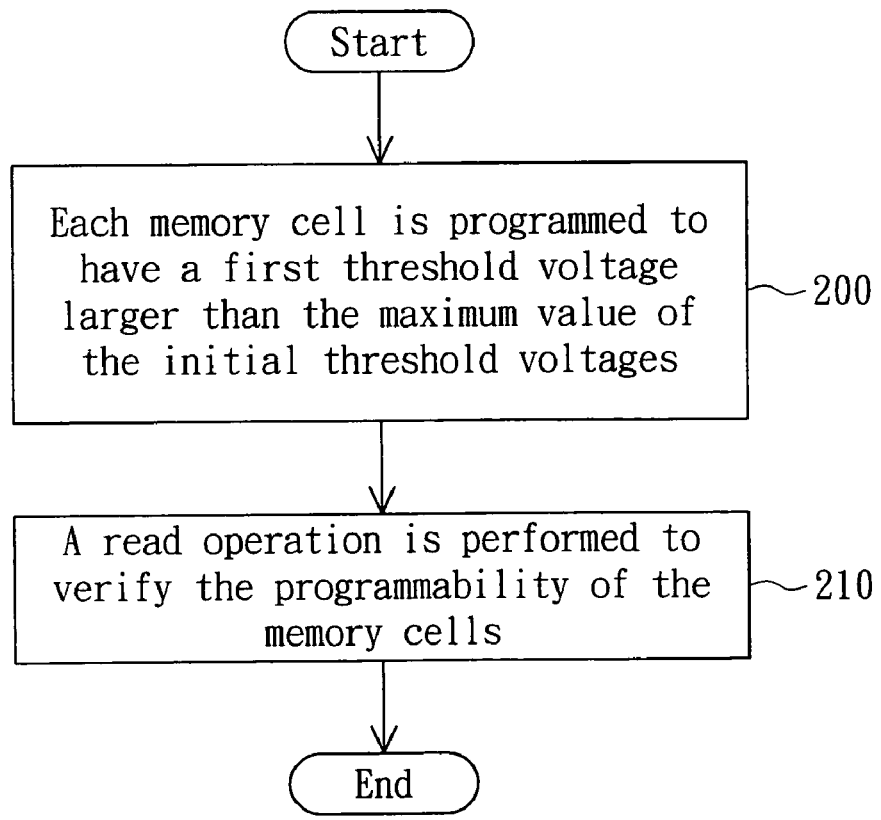
FIG. 2 is a flow chart of the method for testing the OTP memory device according to the preferred embodiment of the invention.
Figure 3:
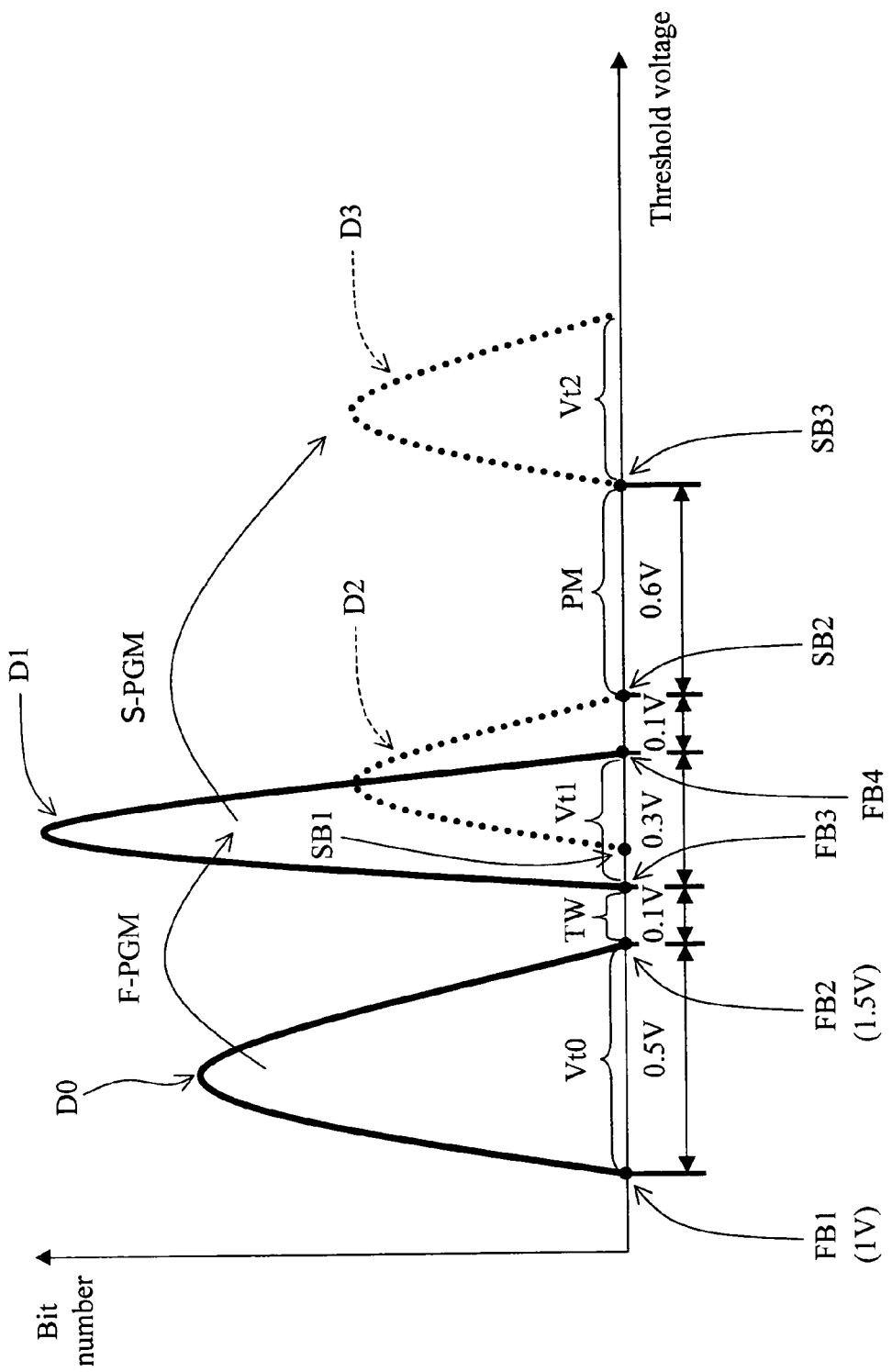
FIG. 3 is a schematic diagram of the bit-number (BN) distribution relative to the threshold voltage according to the preferred embodiment of the invention.

Referring to FIG. 2 and FIG. 3 simultaneously, a flow chart of the method for testing the OTP memory device 100 and a schematic diagram of the bit-number (BN) distribution relative to the threshold voltage according to the preferred embodiment of the invention are shown respectively. Each memory cell 110 has an initial threshold voltage Vt0, and the bit numbers relative to the initial threshold voltages Vt0 of the memory cells 110 form an initial BN distribution D0 as shown in FIG. 3. The minimum value FB1 and the maximum value FB2 of the initial threshold voltages Vt0 are respectively 1V and 1.5V for instance. First, in the step 200 of FIG. 2, a first program (F-PGM) operation is performed to test if the memory cells 110 are good. The memory cells 110 are programmed to have a first threshold voltage Vt1 and form a first distribution D1 as shown in FIG.3, the minimum value FB3 is larger than the maximum value FB2 of the initial threshold voltages Vt0.

As shown in FIG.3, the bit numbers relative to the first threshold voltages Vt1 of the memory cells 110 form a first BN distribution D1. There exists a testing window TW for example: charge loss bake testing, such as having a width of 0.1V, between the first BN distribution D1 and the initial BN distribution D0. Usually the width of the testing window TW depends on the characteristics of the memory cells 110, and the testing window TW can be zero in some cases.

Besides, the difference between the maximum value FB4 and the minimum value FB3 of the first threshold voltages Vt1, such as 0.3V, is smaller than the difference between the maximum value FB2 and the minimum value FB1 of the initial threshold voltages Vt0, such as 0.5V. Therefore, it can be seen from FIG. 3 that the first BN distribution D1 has a taller and more tightened profile than the initial BN distribution D0. The F-PGM operation for testing the memory device 100 programs the memory cells 110 to have a small higher threshold voltage range (FB3, FB4) than the initial range (FB1, FB2) and the tightened profile of the first BN distribution D1 can provide a larger program margin for a user program operation.

Next, in step 210, a read operation is performed to determine if data written into the memory cells 110 in the F-PGM operation can be read and accordingly verify if the memory cells 110 are good. The above-mentioned testing window TW is provided for the testing operation to have a correct verification. After the testing operation, the tester can find out which memory cell 110 is bad and make sure the chip is program OK. When the memory device 100 is test OK, the memory device 100 is directly provided for a user program (S-PGM) operation without need of an erase operation.

As shown in FIG. 3, when the user is to store data into the memory device 100, the memory cells 110 for storing data are programmed to have a second threshold voltage Vt2, and bit numbers relative to the second threshold voltages Vt2 form a second and third BN distribution D2 and D3. The BN distribution D3 has a minimum value SB3 larger than the maximum value FB4 of the first threshold voltages Vt1. In the S-PGM operation, the threshold voltage range of the non-programmed memory cells 110 is slightly shifted to have a maximum value SB2 (>FB4) and a minimum value SB1 (>FB3). The bit numbers relative to the threshold voltage range (SB1, SB2) form a distribution D2. The program margin PM formed between the BN distributions D2 and D3, such as having a width of 0.6V, is served for a circuit window (0.5V) and charge loss (0.1V). It can be seen that the testing window TW is smaller than the program margin PM.

Furthermore, because the F-PGM operation programs each memory cell 110 to have a first threshold voltage Vt1 larger than the maximum value FB2 of the initial threshold voltages Vt0, the memory cells 110 will have less read and program disturb effect after the F-PGM operation.

As mentioned above, the memory device 100 can be tested by performing the F-PGM operation and no erase operations are required as the memory device is test pass and provided for the user program operation. Therefore, the margin for cycling and charge loss window in the S-PGM operation can be largely reduced and the memory cells 110 can be programmed to have a smaller threshold voltage value (Vt2) than that in prior art. Therefore, the prior-art cycling issue can be solved and the quality of the memory cells 110 can be improved.

The OTP memory device and method for testing the same has the following advantages:

1. The test pass memory device in the test program operation can be directly provided for a user program operation without need of erase operations. Therefore, the margin for cycling and charge loss can be reduced and the quality of the memory device can be effectively improved.

2. Without need of the erase operation in the test programming, the extra erase circuit for the erase function is not necessary and thus the size and cost of the memory device can be effectively reduced.

While the invention has been described by way of example and in terms of a preferred embodiment, it is to be understood that the invention is not limited thereto. On the contrary, it is intended to cover various modifications and similar arrangements and procedures, and the scope of the appended claims therefore should be accorded the broadest interpretation so as to encompass all such modifications and similar arrangements and procedures.

What is claimed is:

1. A one-time-programmable (OTP) memory device, comprising:
a plurality of memory cells, each memory cell having an initial threshold voltage, wherein each memory cell is programmed to have a first threshold voltage larger than a maximum value of the initial threshold voltages and a user program operation is performed directly on the programmed memory cells.

2. The OTP memory device according to claim 1, wherein a read operation is performed on the programmed memory cells to test if the memory cells are good.

3. The OTP memory device according to claim 2, wherein a testing window of threshold voltage is formed between a minimum value of the first threshold voltages and the maximum value of the initial threshold voltages for the testing operation.

4. The OTP memory device according to claim 3, wherein the testing window is smaller than a program margin of the user program operation.

5. The OTP memory device according to claim 3, wherein each programmed memory cell has a second threshold voltage larger than a maximum value of the first threshold voltages in the user program operation.

6. The OTP memory device according to claim 1, wherein the difference between a maximum value and a minimum value of the first threshold voltages is smaller than the difference between the maximum value and a minimum value of the initial threshold voltages.

7. The OTP memory device according to claim 1, is a read-only memory (NROM) device.

8. The OTP memory device according to claim 1, is a floating gate device.

9. A method for testing an OTP memory device, the memory device comprising a plurality of memory cells, each memory cell having an initial threshold voltage, the method comprising:
performing a first program operation on the memory device such that each memory cell has a first threshold voltage larger than a maximum value of the initial threshold voltages; and
performing a read operation on the memory device to test if the memory cells are good, wherein when the memory device is test OK, the memory device is directly provided for a user program operation and the user program operation is performed directly on the programmed memory cells.

10. The method according to claim 9, wherein the step of performing the first program operation on the memory device further comprises forming a testing window between the maximum value of the initial threshold voltages and the minimum value of the first threshold voltages for the testing operation.

11. The method according to claim 10, wherein the testing window is smaller than a program margin for the user program operation.

12. The method according to claim 9, wherein performing the first program operation on the memory device further comprises programming the memory cells such that the difference between a maximum value and a minimum value of the first threshold voltages of the memory cells is smaller than the difference between the maximum value and a minimum value of the initial threshold voltages.

* * * * *